(12) United States Patent
Love et al.

(10) Patent No.: US 12,253,394 B2
(45) Date of Patent: Mar. 18, 2025

(54) VELOCITY MEASUREMENTS USING A PIEZOELECTRIC SENSOR

(71) Applicant: Board of Regents, The University of Texas System, Austin, TX (US)

(72) Inventors: Norman Love, El Paso, TX (US); Yirong Lin, El Paso, TX (US); Jad Aboud, El Paso, TX (US); David Tucker, El Paso, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 364 days.

(21) Appl. No.: 17/100,409

(22) Filed: Nov. 20, 2020

(65) Prior Publication Data
US 2021/0223281 A1 Jul. 22, 2021

Related U.S. Application Data

(60) Provisional application No. 62/937,873, filed on Nov. 20, 2019.

(51) Int. Cl.
| | |
|---|---|
| *G01F 1/28* | (2006.01) |
| *G01P 5/04* | (2006.01) |
| *G01P 5/24* | (2006.01) |
| *H10N 30/30* | (2023.01) |

(52) U.S. Cl.
CPC ............... *G01F 1/28* (2013.01); *G01P 5/04* (2013.01); *G01P 5/24* (2013.01); *H10N 30/306* (2023.02)

(58) Field of Classification Search
CPC .......... G01F 1/28; H01L 41/08; H01L 41/113; H01L 41/1134; H01L 41/1138; H10N 30/00; H10N 30/30; H10N 30/304; H10N 30/308; H10N 30/306
See application file for complete search history.

(56) References Cited

U.S. PATENT DOCUMENTS

| | | | | |
|---|---|---|---|---|
| 3,818,877 | A * | 6/1974 | Barrera | G01F 1/3287 |
| | | | | 73/861.23 |
| 3,935,484 | A * | 1/1976 | Leschek | G01N 29/14 |
| | | | | 310/346 |
| 6,298,734 | B1 * | 10/2001 | Storer | G01F 1/3266 |
| | | | | 73/861.24 |
| 2008/0307894 | A1 * | 12/2008 | Nuber | G01F 1/3209 |
| | | | | 73/861.24 |
| 2015/0126889 | A1 * | 5/2015 | Frey | G01F 1/3266 |
| | | | | 600/538 |
| 2015/0292922 | A1 * | 10/2015 | Downie | G05D 7/0635 |
| | | | | 73/30.03 |

* cited by examiner

*Primary Examiner* — Erika J. Villaluna
(74) *Attorney, Agent, or Firm* — Yee & Associates, P.C.

(57) ABSTRACT

A method of measuring fluid flow rate is provided. The method comprises positioning a piezoelectric sensor in a fluid flow stream and measuring a voltage output from the piezoelectric sensor caused by mechanical stress from the fluid flow stream. A fluid flow rate is calculated based on the measured voltage output according to predefined relationships between the voltage output and a number physical parameters.

20 Claims, 11 Drawing Sheets

VELOCITY MEASUREMENTS USING A PIEZOELECTRIC SENSOR

CROSS REFERENCE TO RELATED APPLICATIONS

This application is related to and claims the benefit of priority of provisional U.S. Patent Application Ser. No. 62/937,873 filed Nov. 20, 2019, which is hereby incorporated by reference.

GOVERNMENT LICENSE RIGHTS

This invention was made with support by the U.S. Department of Energy/National Nuclear Security Administration under award DE-NA-0003330. The United States Government has certain rights in this invention.

BACKGROUND INFORMATION

1. Field

The present disclosure relates to piezoelectrics and sensor systems.

2. Background

Realtime monitoring of various parameters in power generation systems has several advantages. Operation of a system with a smaller margin of safety allows for performance of parameters closer to the material limits, increasing the potential to attainment of higher efficiencies. For example, thermoelectric and pyroelectric sensors can wirelessly detect temperature inside of a power generation unit at places where thermocouples cannot reach, which would allow for real-time health monitoring and material temperatures in places such as turbomachinery of the unit.

Other parameters such as velocity may also provide insight into some behaviors of turbomachinery or flow rate within a system. This is particularly attractive if the sensor is capable of detecting rapid changes in the flow or pressure in the area of measurement. Piezoelectrics have been used frequently in the past for pressure measurements. However, flow velocity measurements using the same material are not as well documented in literature possibly due to the nonlinearities between the flow and physical properties of the piezoelectric.

Therefore, it would be desirable to have a method and apparatus that take into account at least some of the issues discussed above, as well as other possible issues.

SUMMARY

An illustrative embodiment provides a method of measuring fluid flow rate. The method comprises positioning a piezoelectric sensor in a fluid flow stream and measuring a voltage output from the piezoelectric sensor caused by mechanical stress from the fluid flow stream. A fluid flow rate is calculated based on the measured voltage output according to predefined relationships between the voltage output and a number physical parameters.

Another illustrative embodiment provides an apparatus for measuring fluid flow rate. The apparatus comprises a fan operable to generate a fluid flow stream, a piezoelectric sensor positioned in the fluid flow stream, and a test section in fluid communication with the fan, wherein the piezoelectric sensor is positioned in the test section. An oscilloscope connected to the piezoelectric sensor measures a voltage output from the piezoelectric sensor caused by mechanical stress from the fluid flow stream, wherein the measured voltage output is correlated to fluid flow rate according to predefined relationships between the voltage output and a number physical parameters.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Figure 1A:
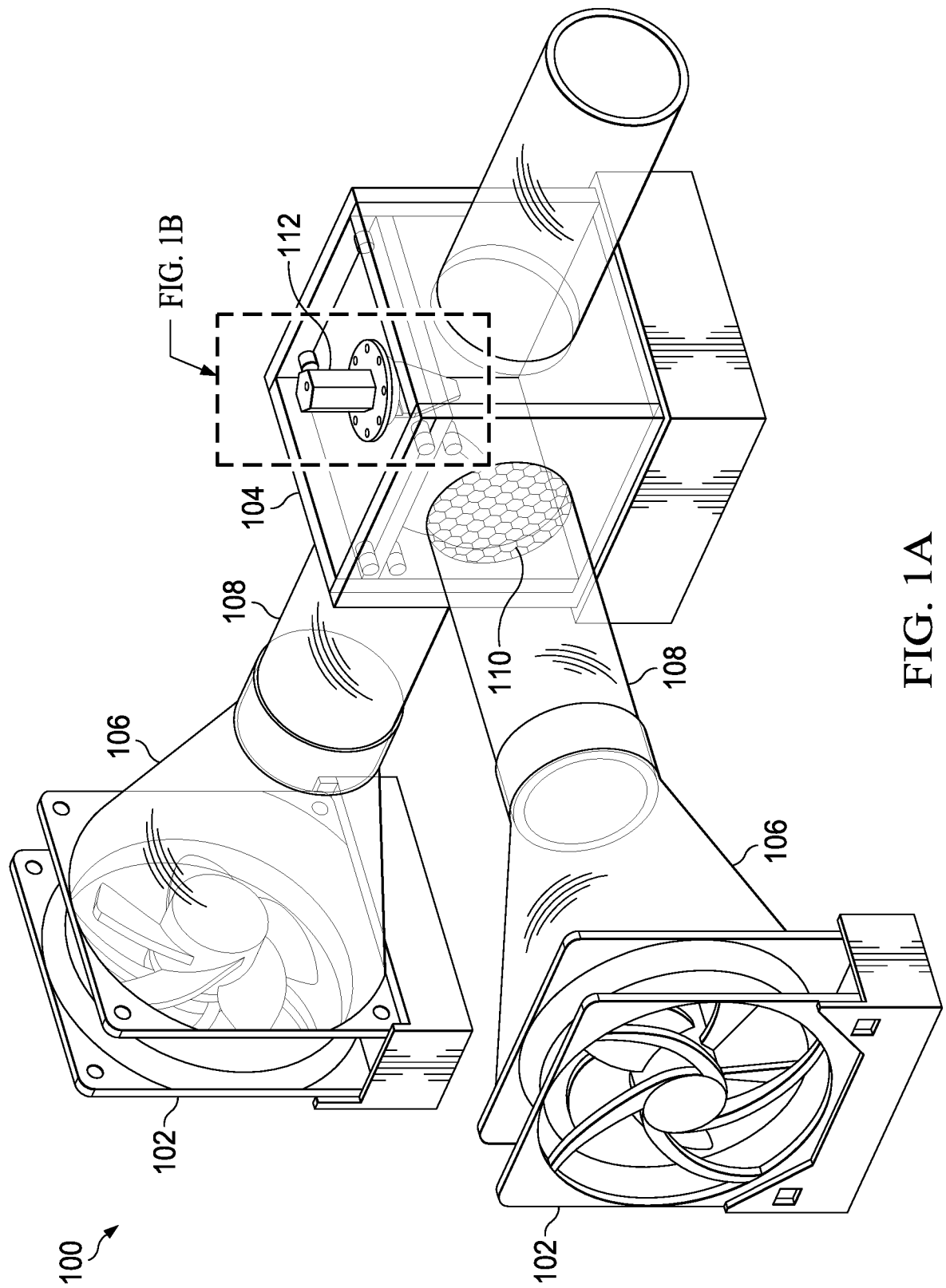
FIG. 1A illustrates perspective view of an apparatus 100 with a rectangular test section (RTS) in accordance with an illustrative embodiment.

The illustrative embodiments recognize and take into account one or more different considerations. For example, the illustrative embodiments recognize and take into account that a piezoelectric cantilever beam can be used to measure velocity of a fluid. The illustrative embodiments recognize and take into account that piezoelectrics are thought to be advantageous due to fast response time, potential durability at higher temperatures, and self-powered characteristics.

The illustrative embodiments also recognize and take into account that many studies have been done with piezoelectric as energy harvesting devices. These energy-harvesting piezoelectric devices capture wind energy, and convert the fluctuations caused by the fluid to electrical current. The devices are subject to fluid flow that cause stress and bending on the piezoelectric. In nearly all cases, this motion is converted to electricity. However, the generated signal can also be analyzed to identify flow characteristics such as velocity. Previous designs that involve piezoelectrics include cantilever beams that vibrate due to vortices produced by fluid flows, such as in a Vortex flow meter. Many of these sensors in this configuration are also used to harvest energy.

Studies have used a Lead Zirconium Titanate (PZT) microcantilever as an air flow sensor and for wind-driven energy harvesting. The studies obtained flow sensing sensitivity of 9 mV/(m/s). With a 100 kΩ load the sensor produced 18.1 mV and 3.3 nW at a flow velocity of 15.6 m/s. Some development utilizes a piezo leaf which converts wind into electrical energy through a fluttering motion. The device is a dangling crossflow stalk, which can amplify the vibration by an order of magnitude. The experimental demonstration showed a peak output power of 0.6 mW and max power density of 2 mW/cm$^3$.

A normalized theoretical model has also been developed for a piezoelectric vibrational energy harvester. Parameters proposed as influencing the generator are coupling, loss coefficients, and the mechanical quality factor.

Another variation uses a piezoelectric flow energy harvester based on a piezoelectric cantilever with a cylindrical extension. The flow induction vibrates the extension at the natural frequency. The interaction between the cylindrical extension and the ambient flow drives the cantilever to vibrate and generate electricity. It was found that the device generates higher voltage in turbulent flows compared to laminar. Turbulence excitation was the dominant driving mechanism with additional contribution from vortex shedding excitation in the lock-in region. The frequency of the induced voltage remained at the natural frequency at any wind velocity, which can help simplify the design of the external circuit.

Another method comprises a cantilevered piezoelectric beam positioned in a heating, ventilation and air conditioning (HVAC) flow for powering a wireless sensor node for HVAC monitoring systems. This method uses an aerodynamic fin attached at the end of the piezoelectric cantilever and the vortex shredding downstream from the bluff body. Power output from this device was between 100 and 3000 μW for flow speeds in the range of 2-5 m/s.

Piezoelectric flow energy harvesting has also been studied to power up systems in deep oil wells. The sensing element used is a bimorph cantilever beam placed in a flow channel. The piezoelectric cantilever uses produced an output power of 20 mW at a volumetric flow rate of 20 SLPM/min.

Many factors influence the ability of a sensor to harvest energy or produce a signal, such as the geometry of the device used. A common shape for energy harvesting piezoelectrics is a cantilever beam. Depending on the type of beam shape used in previous studies, fluid flow around the device is disturbed. The magnitude of the disturbance depends on many factors but has been directly related to the device shape and cross-sectional area. As a result, many studies have been conducted to test different shapes and cross sections. Investigation of the energy harvesting performance of trapezoidal cantilevers with irregular cross-sections shows a dependency between strain and electrical output of the piezoelectric sensor geometry. Other results show that the generated electric power for a geometry modified piezoelectric cantilever is more than 11.5 times greater than the power obtained from a conventional cantilever. Enhanced output power has been achieved by using a bimorph piezoelectric with a flexible 3D meshed-core elastic layer. This design can reduce the bending stiffness of the cantilever and lower the resonance frequency by 15.8%. The output power is 68% higher compared to a conventional solid-core cantilever beam.

Placement of the beam within the flow also plays an important role in the performance of the sensor. A correlation has been established between the placement and orientation of the beam and the output signal of the piezoelectric material. Piezoelectric materials have high strength, are relatively easy to manufacture, are low maintenance, and can be compact. Piezoelectric-based ceramics include properties such as high impact sensitivity and frequency signals and detection for locating impacts and vibrations.

The illustrative embodiments recognize and take into account that most of the methods developed focus on harvesting energy from wind or air flow and found a direct relationship between fluid flow, geometry, and energy harvesting ability at the micro and macro scale. In addition, in nearly all studies presented in literature, the energy produced by the piezoelectric is used for energy storage purposes. However, the voltage generated from the interaction between the fluid and the piezoelectric could be utilized to characterize the flow.

The illustrative embodiments provide a piezoelectric cantilever beam placed in a flow stream and used to measure velocity of a fluid. Different sized piezoelectrics made of the same material can be used. The impact of velocity profile is determined by exposing the piezoelectric to various velocity profiles with different test sections.

The voltage increases non-linearly as the velocity is increased in the test sections of the experimental setups for both piezoelectrics. This suggests that the piezoelectric voltage output can be calibrated to correspond to different flow velocities.

The larger piezoelectric, Piezo-P, produces significantly more voltage than the smaller piezoelectric, Piezo-J. Piezo-P has a maximum output voltage 4.8 times higher than Piezo-J when subjected to a uniform flow in the circular test setup. This higher voltage has been attributed to the increased size of the sensor that causes more drag force. Drag force is calculated to be 4.5 times greater for Piezo-P compared to Piezo-J.

Due to non-uniformity of the velocity profiles in the second test setup, Piezo-P produces more than 142.5 times more voltage output compared to Piezo-J. The larger area occupying the test section, the higher average velocity seen by Piezo-P away from the wall, as well as other factors, result in a significantly higher output signal.

The feasibility of using this type of flow meter is presented for air flow but could be used with various other fluids and environmental conditions.

Figure 1B:
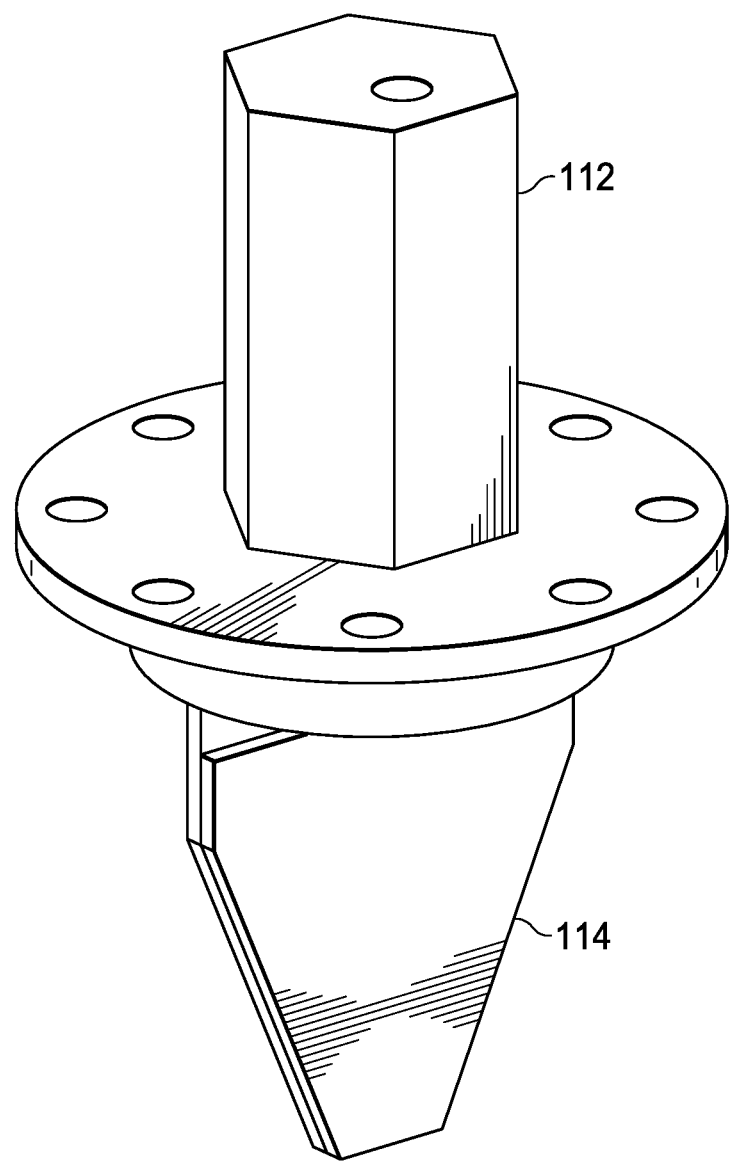
FIG. 1B illustrates a callout of a piezoelectric sensing element and mount in accordance with an illustrative embodiment.

FIG. 1A illustrates perspective view of an apparatus 100 with a rectangular test section (RTS) in accordance with an illustrative embodiment. FIG. 1B depicts a callout of a piezoelectric sensing element and mount in accordance with an illustrative embodiment.

Figure 4:
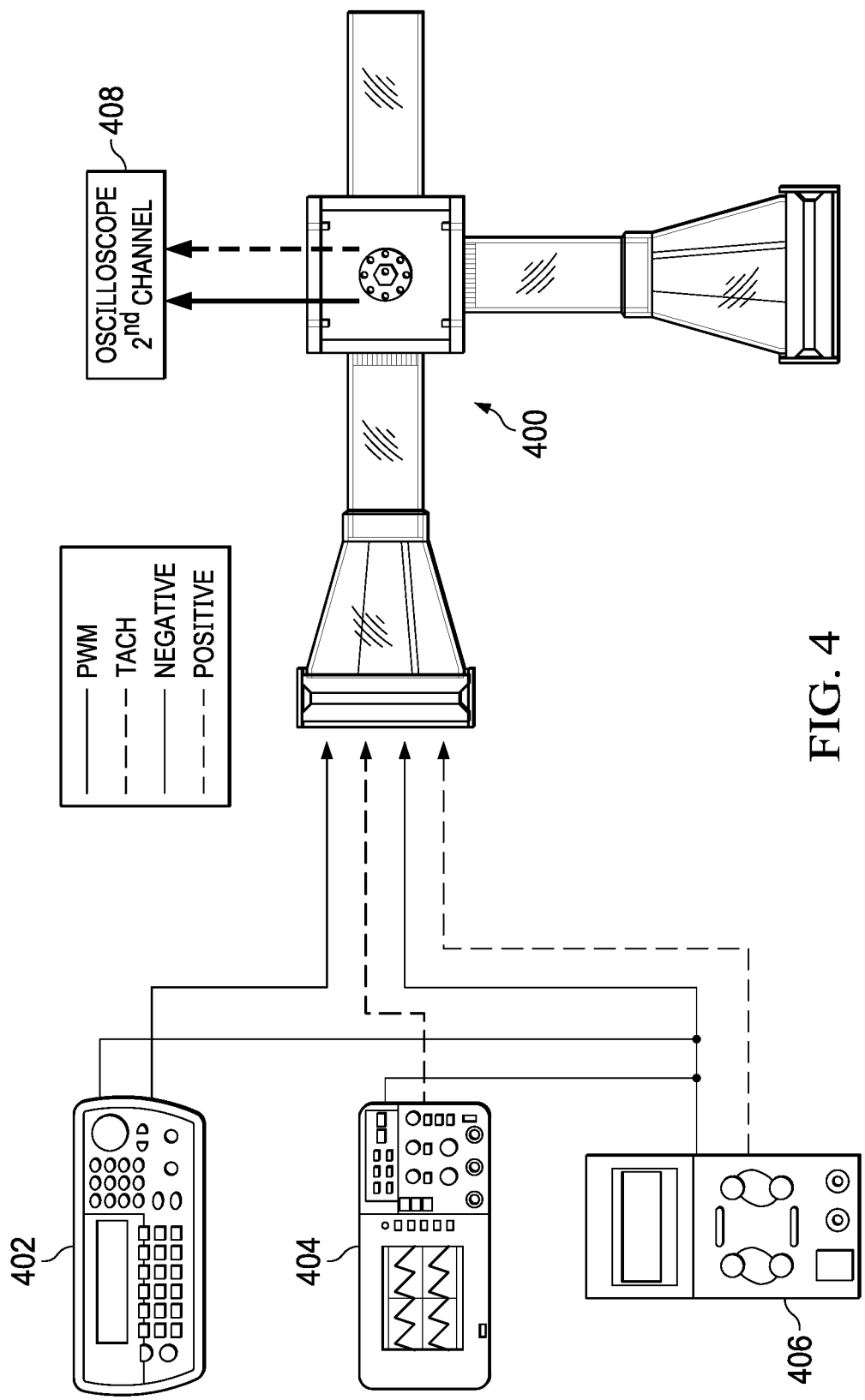
FIG. 4 illustrates a tope view of an RTS layout and control schematic of an oscilloscope system in accordance with an illustrative embodiment.

Fans 102 are connected to the test chamber 104 though respective reduction couplings 106 and flow delivery tubes 108. The fans 102 can generate air flow at room temperature and pressure at velocities ranging between 0 to 15 m/s. Air flow is passed through a flow straightener 110 located at the base of the inlet flow delivery tubes 108 to straighten the flow. The air enters the test chamber 104, where it interacts with the piezoelectric test article 114. The piezoelectric 114 is attached to mount 112 at the center of the test chamber 104 and bolted into place. The drag force and pressure differences occurring in the test section 104 cause the piezoelectric 114 to vibrate and generate stress that results in a voltage output from the sensing element 114. This voltage is measured and recorded using an oscilloscope, as shown in FIG. 4.

Figure 2:
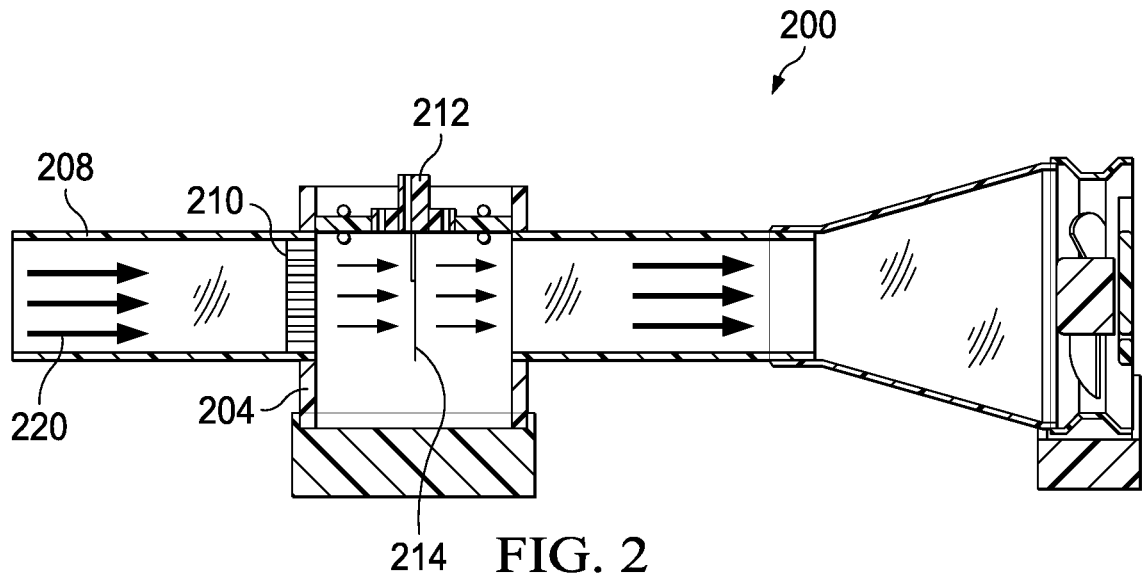
FIG. 2 illustrates a partial side cross-section view of an RTS setup with Piezo-P configuration in accordance with an illustrative embodiment.

FIG. 2 illustrates a partial side cross-section view of an RTS setup 200 with Piezo-P configuration in accordance with an illustrative embodiment. Setup 200 might be implemented with apparatus 100 shown in FIG. 1A.

Air flow 220 passes through flow straightener 210 located at the base of the inlet tube 208 to straighten the flow. The air enters the test chamber 204, where it interacts with the Piezo-P piezoelectric test article 214. The piezoelectric 214 is attached to mount 212 at the center of the test chamber 204 and bolted into place.

Figure 3:
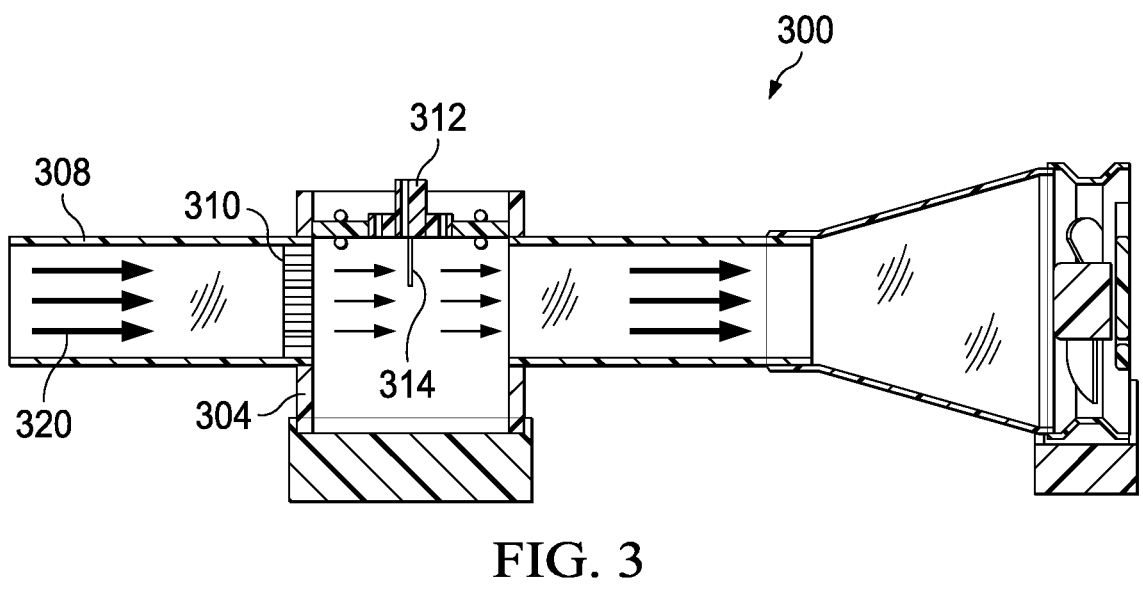
FIG. 3 illustrates a partial side cross-section view of an RTS setup with Piezo-J configuration in accordance with an illustrative embodiment.

FIG. 3 illustrates a partial side cross-section view of a rectangular test section setup 300 with Piezo-J configuration in accordance with an illustrative embodiment. Setup 300 might be implemented with apparatus 100 shown in FIG. 1A.

Air flow 330 passes through flow straightener 310 located at the base of the inlet tube 308 to straighten the flow. The air enters the test chamber 304, where it interacts with the Piezo-J piezoelectric test article 314. The piezoelectric 314 is attached to mount 312 at the center of the test chamber and bolted into place.

In illustrative examples shown in FIGS. 1-3, the rectangular test section 104, 204, 304 can include six acrylic walls with a thickness of, e.g., 0.6 cm. The inner dimensions of the cube test section 104, 204, 304 might be, e.g., 10×10×10 cm. Three of the side walls can have a, e.g., 5.72 cm diameter hole in the center for air flow. Two of ports are used for inlet flow and are adjacent to each other, while the other is used for an outlet. In the illustrative embodiments, only two of the three ports are used. The third port might be plugged to only allow flow in one direction relative to the sensor. The top wall is adjustable in height and can be held in place by pins inserted in two of the side walls. The set height for the test chamber in the present examples is 8 cm. The top wall has 1.8 cm diameter port at the center to insert the sensor mounting connected to the piezoelectric sensor.

In the illustrative examples, the mounting of the sensor can made of polylactide (PLA) and the sensor is placed perpendicular to the flow. In this illustrative example, a DC axial fan with a nominal voltage of 24V, capable of running from 0-9500 RPM can provide the air flow. The fans are powered by a power supply. Each fan is connected to the test chamber through an acrylic tube and a reduction adapter that allows the flow to go from the fan to the chamber inlets through the tubes. The generated signal can be measured and acquired by an oscilloscope connected to the piezoelectric sensors.

FIG. 4 illustrates a tope view of an RTS layout and control schematic of an oscilloscope system in accordance with an illustrative embodiment. Oscilloscope system comprising function generator 402, oscilloscope 404, and power supplier 406 provides input to RTS 400. A second oscilloscope channel 408 provides output of the generated signal.

Figure 5:
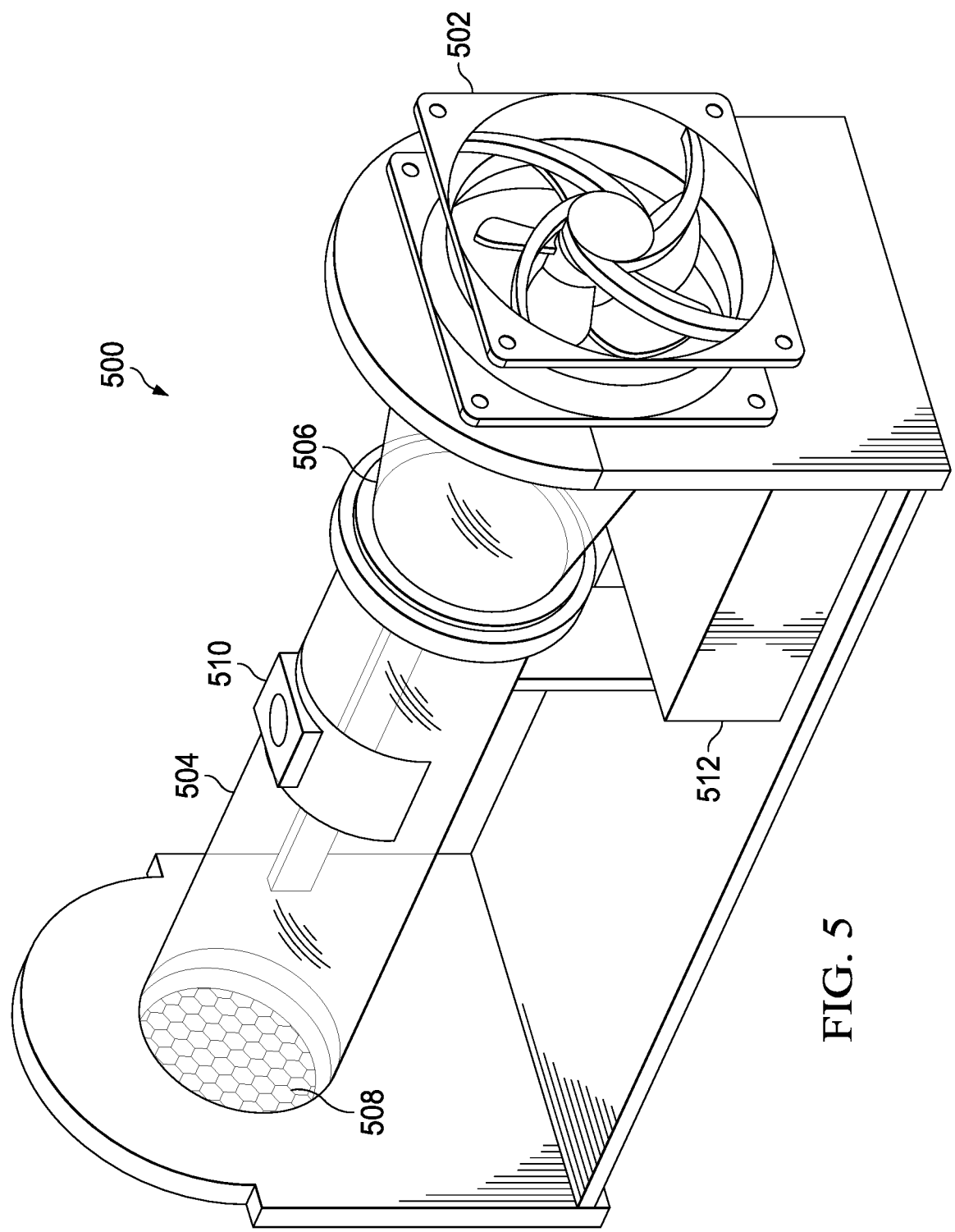
FIG. 5 illustrates perspective view of a wind tunnel with a circular test section (CTS) in accordance with an illustrative embodiment.

FIG. 5 illustrates perspective view of a wind tunnel 500 with a circular test section (CTS) in accordance with an illustrative embodiment. Fan 502 is connected to the circular test section 504 though a reduction coupling 506 and is controlled by controller 512. Air flow and liquid pass through flow straightener 508. The air passes through the circular test section 504, where it interacts with the piezoelectric test article 510. In this illustrative example, the circular test section 504 is 10 cm diameter. The piezoelectric sensor is placed into the circular test section 504 and exposed to the fluid.

Air is used as the working fluid at a controlled flow rate. Piezoelectric sensing element is mounted on a holder 510 and placed into the wind tunnel test section 504. The piezoelectric sensor is fixed on one end of the mounting 510 and allowed to be free on the other end of the mounting (see FIGS. 6 and 7). In the illustrative embodiments, the positioning of the piezoelectric is maintained perpendicular to the air flow. Similar to the RTC described above, an oscilloscope can be used to collect the signal from the sensing elements.

The flow rate is driven by manipulating the fan speed. The flow velocity can be varied at average velocities of 2, 4, 9, and 14 m/s for States 1, 2, 3, and 4, respectively. These values are based on preset fan control settings.

Figure 6:
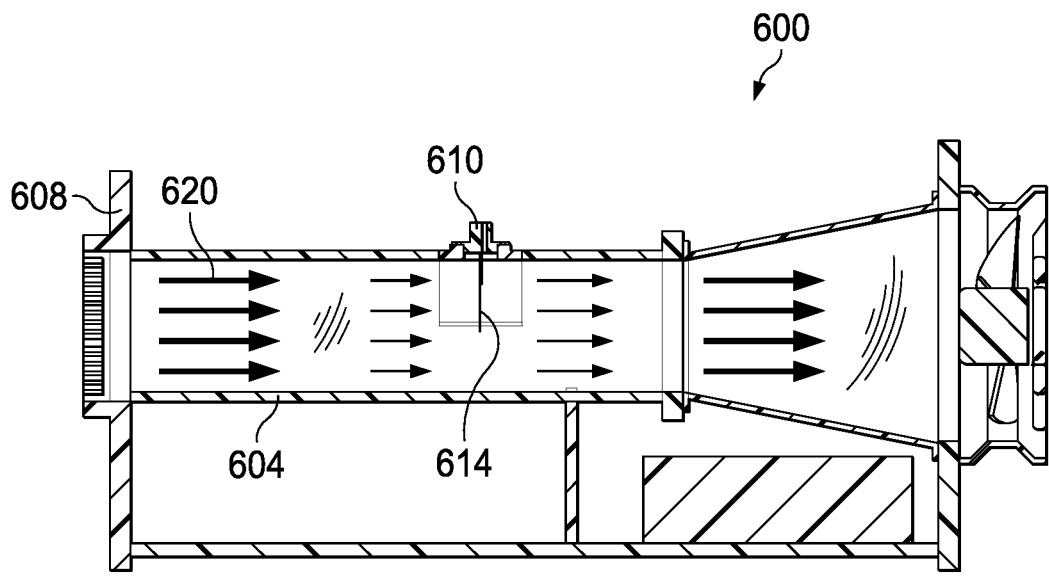
FIG. 6 illustrates a partial cross-section side view of a CTS wind tunnel setup with Piezo-P configuration in accordance with an illustrative embodiment.

FIG. 6 illustrates a partial cross-section side view of a CTS wind tunnel setup 600 with Piezo-P configuration in accordance with an illustrative embodiment. Setup 600 might be implemented with wind tunnel 500 shown in FIG. 5.

Air flow 620 passes through flow straightener 608 and enters the test chamber 604, where it interacts with the Piezo-P piezoelectric sensor 614. The piezoelectric sensor 614 is attached to mount 610, which is bolted into place in the test chamber 604.

Figure 7:
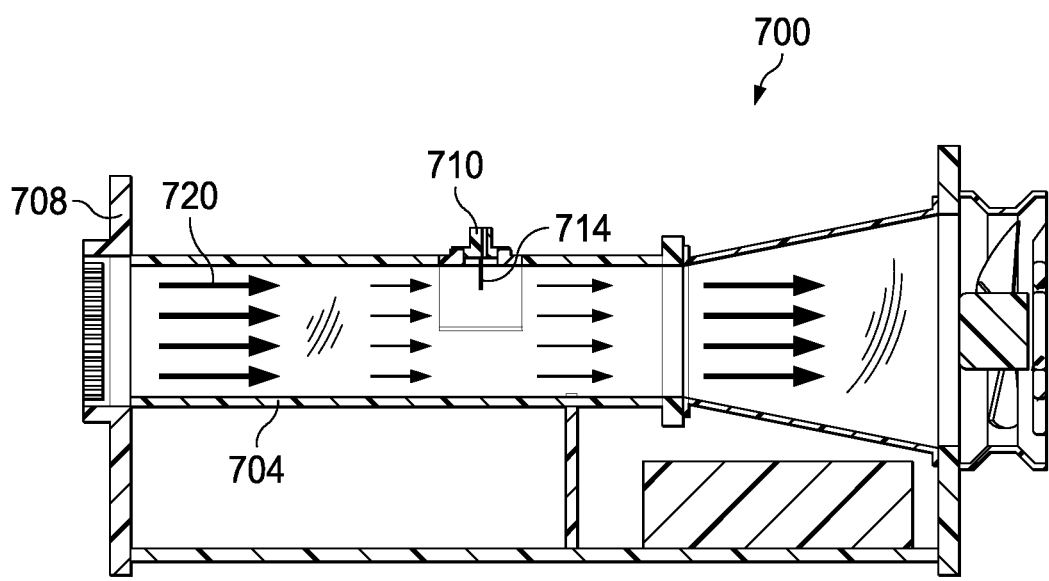
FIG. 7 illustrates a partial cross-section side view of a CTS wind tunnel setup with Piezo-J configuration in accordance with an illustrative embodiment.

FIG. 7 illustrates a partial cross-section side view of a CTS wind tunnel setup 700 with Piezo-J configuration in accordance with an illustrative embodiment. Setup 700 might be implemented with wind tunnel 500 shown in FIG. 5.

Air flow 720 passes through flow straightener 708 and enters the test chamber 704, where it interacts with the Piezo-J piezoelectric sensor 714. The piezoelectric sensor 714 is attached to mount 710, which is bolted into place in the test chamber 704.

Figure 8A:
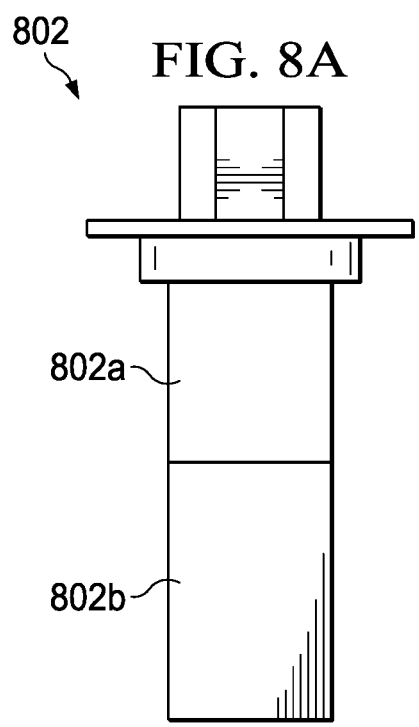
FIG. 8A illustrates a front plan view of a Piezo-P configuration piezoelectric sensor in accordance with an illustrative embodiment.
Figure 8B:
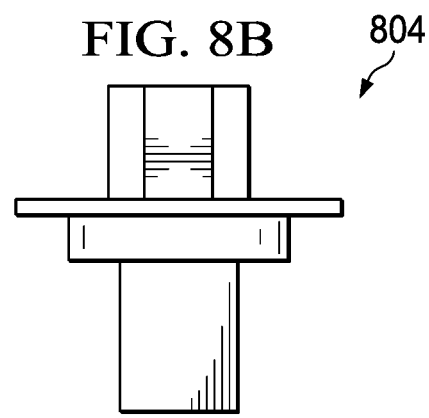
FIG. 8B illustrates a front plan view of a Piezo-J configuration piezoelectric sensor in accordance with an illustrative embodiment.

FIG. 8A illustrates a front plan view of a Piezo-P configuration piezoelectric sensor in accordance with an illustrative embodiment. FIG. 8B illustrates a front plan view of a Piezo-J configuration piezoelectric.

Both Piezo-P sensor 802 and Piezo-J sensor 804 can be made from Lead Zirconate Titanite (PZT). The Piezo-J sensor 804 is thicker than the other piezo ceramic in Piezo-P sensor 802. The piezoelectric sensors 802, 804 have different dimensions but are both rectangular in shape. Piezo-J 804 might have dimensions of, e.g., 2.0×1.5 cm with a thickness of 0.1 cm.

Piezo-P 802 comprises two sections: the piezoelectric ceramic 802a and extended area (flapper) 802b. Piezoelectric ceramic section 802a might have dimensions of, e.g., 2.3×2.0 cm with a thickness of 0.06 cm. Extended area 802b might have a thickness of, e.g., 0.016 cm. The dimensions of Piezo-P 802 might be, e.g., 5.8×2.0 cm.

Piezo-P 802 and Piezo-J 804 might be similar in material composition. The composite materials can be a blend of the ceramics with an epoxy or polymer to lower acoustical impedance and produce a higher coupling coefficient. Table 1 summarizes the properties of the piezoelectric material that is used. Piezo-P 802 and Piezo-J 804 are connected to the piezoelectric via cables wires (not shown) on both sides of the piezoelectric ceramic. The piezoelectric elements are connected to an oscilloscope channel in order to capture data.

TABLE 1

Piezoelectric properties

| PROPERTY | Units | Symbol | |
|---|---|---|---|
| Coupling Coefficient | — | $K_t$ | 0.45 |
| | | $K_{31}$ | 0.34 |
| Frequency constant | Hz. m | $N_p$ | 2200 |
| | | $N_t$ | 2070 |
| Piezoelectric constant | × $10^{-12}$ m/v | $N_{31}$ | 1680 |
| | | $d_{33}$ | 320 |
| | | $d_{31}$ | −140 |
| Dielectric Constant | @ 1 kHz | $\varepsilon_{33}^T/\varepsilon_0$ | 1400 |
| Curie Temperature | ° C. | $T_c$ | 320 |
| Density | g/cm³ | $\rho$ | 7.9 |

The coupled electro-mechanical behavior of piezoelectric materials is defined by two linearized constitutive equations, as shown in in Eqs. (1) and (2).

$$\varepsilon_i = S_{ij}^D \sigma_j + d_{mi} E_m \quad (1)$$

$$D_m = d_{mi} \sigma_i + \xi_{ik}^\sigma E_k \quad (2)$$

Where the indexes refer to different directions within the material coordinate system, σ is the stress vector, ε is strain vector, E is the vector of applied electric field, S are the matrix of compliance coefficients, D is vector of electric displacement, ξ is permittivity, d is the matrix of piezoelectric strain constants, and D and E represent measurements taken at constant electric displacement, constant electric field and constant stress.

After a piezoelectric transducer is mechanically stressed, the sensor generates a voltage. This phenomenon is governed by the direct piezoelectric effect shown by Eq (1). This property makes piezoelectric transducers suitable for sensing applications. If a sensor is subject to a stress field, assuming the applied electric field is zero, the resulting electrical displacement vector is:

$$\begin{Bmatrix} D_1 \\ D_2 \\ D_3 \end{Bmatrix} = \begin{Bmatrix} 0 & 0 & 0 & 0 & d_{15} & 0 \\ 0 & 0 & 0 & d_{15} & 0 & 0 \\ d_{31} & d_{31} & d_{33} & 0 & 0 & 0 \end{Bmatrix} \begin{Bmatrix} \sigma_1 \\ \sigma_2 \\ \sigma_3 \\ \tau_{23} \\ \tau_{31} \\ \tau_{12} \end{Bmatrix} \quad (3)$$

The generated charge can be determined from Eq. (4).

$$q = \int\int [D_1 \; D_2 \; D_3] \begin{bmatrix} dA_1 \\ dA_2 \\ dA_3 \end{bmatrix} \quad (4)$$

Where $dA_1$, $dA_2$ and $dA_3$ are the differential electrode areas in the 2-3, 1-3 and 1-2 planes. The generated voltage $V_p$ is related to the charge via Eq. (5):

$$V_p = \frac{q}{C_p} \quad (5)$$

Where $C_p$ is capacitance of the piezoelectric sensor. The piezoelectric effect results from the linear electromechanical interaction between the mechanical and electrical states in crystalline materials with no inversion symmetry. Many forces may impact the stress field. However, based on the experimental setup it is hypothesized that the major contributor to internal stress is the drag force, Eq (6).

$$F_D = \frac{1}{2}\rho A C_D v^2 \quad (6)$$

Where $F_D$ is the drag force, ρ is the fluid density of air at room temperature and pressure, A is the surface contact area between the fluid and body, $C_D$ is the drag coefficient, and v is the average velocity of the fluid acting on the surface of the body. The drag coefficient is estimated based on flow perpendicular to a flat plate. The coupling of force and voltage generated in the sensor material is used to determine the velocity of a flow field.

In the illustrative embodiments, the velocity profile inside the test section of the CTS can be measured with a hotwire anemometer to calculate the average velocity acting on the surface of the piezoelectric. The velocity profiles are measured at the same location of the position of the piezoelectric sensor. The velocity profiles within the test section of the CTS are measured at preset settings of States 1 to 4. The velocities associated with these states is presented in Table 2. The four different states correspond to different preset values on each experimental setup.

TABLE 2

Velocities tested in the circular and rectangular test section setups

| | Circular Test Section Setup Velocity (m/s) | Rectangular Test Section Setup Velocity (m/s) |
|---|---|---|
| State 1 | 1.9 | — |
| State 2 | 4.3 | 4.2 |
| State 3 | 9.0 | 8.4 |
| State 4 | 14.5 | 13.4 |

Figure 9:
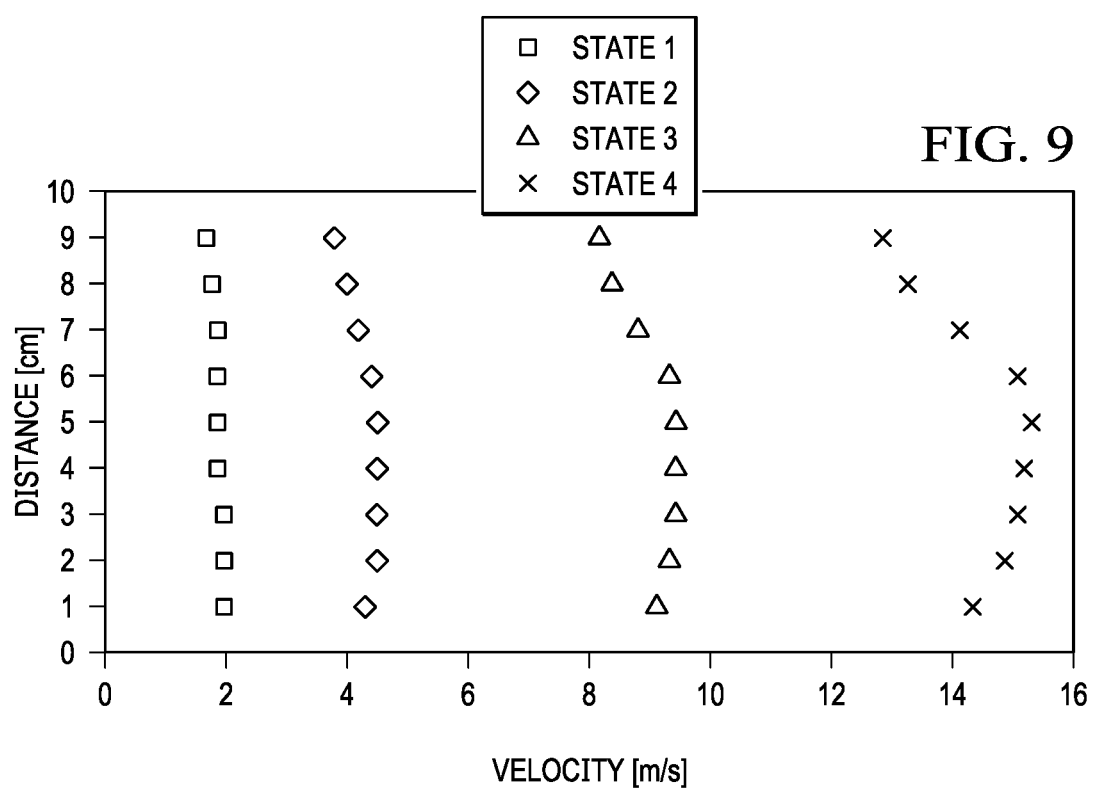
FIG. 9 depicts a graph illustrating the velocity profiles at the location of the sensor in the circular cross section setup in accordance with an illustrative embodiment.

FIG. 9 depicts a graph illustrating the velocity profiles at the location of the sensor in the circular cross section setup in accordance with an illustrative embodiment. The y-axis represents the distance at the centerline of the test section measured in a vertical direction. The circular test section has a diameter of 10 cm. However, the velocity profile near the wall was not measured due to the size the of hot wire anemometer. At all conditions, the velocity profiles in the CTS were nearly uniform due to the presence of the flow straightener upstream of the test section. At higher velocities, e.g., States 3 and 4, the profiles were more strongly influenced by the presence of the wall and no-slip condition as demonstrated by the higher velocity near the center of the tube. These data are used to calculate the average velocity of the air in contact with the piezoelectric sensor, values shown in Table 2. The velocity profiles within the rectangular test section are also measured at preset settings of State 1 to 4.

Figure 10:
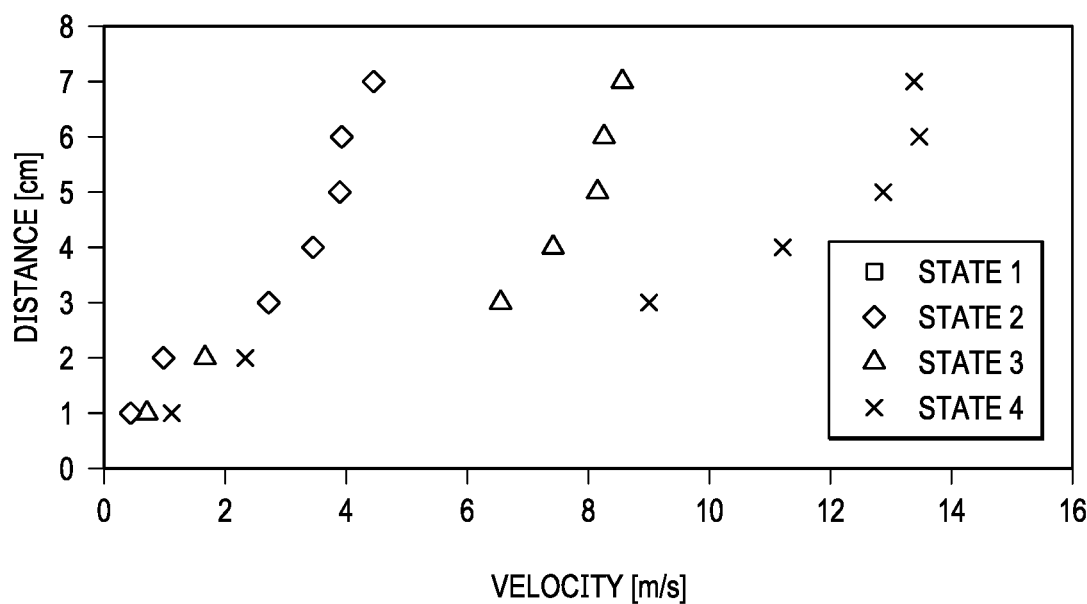
FIG. 10 depicts a graph illustrating the velocity profiles at the location of the sensor in the rectangular cross section setup in accordance with an illustrative embodiment.

FIG. 10 depicts a graph illustrating the velocity profiles at the location of the sensor in the rectangular cross section setup in accordance with an illustrative embodiment. The test section has height of 8 cm. Near wall velocities are not recorded due to the size the of hot wire anemometer. For these velocity profiles, low velocity is measured near the bottom and top portions of the test section. In the present example, the system is not able to produce average velocity profiles lower than 4 m/s due to limitations of the test setup. After exposure to these profiles, the root mean square (RMS) value of the signal measured from the sensor is then processed using data acquisition software then averaged over the time duration of the test. The measurements are repeated several times and the uncertainties estimated with t-test at 95% confidence level.

Figure 11:
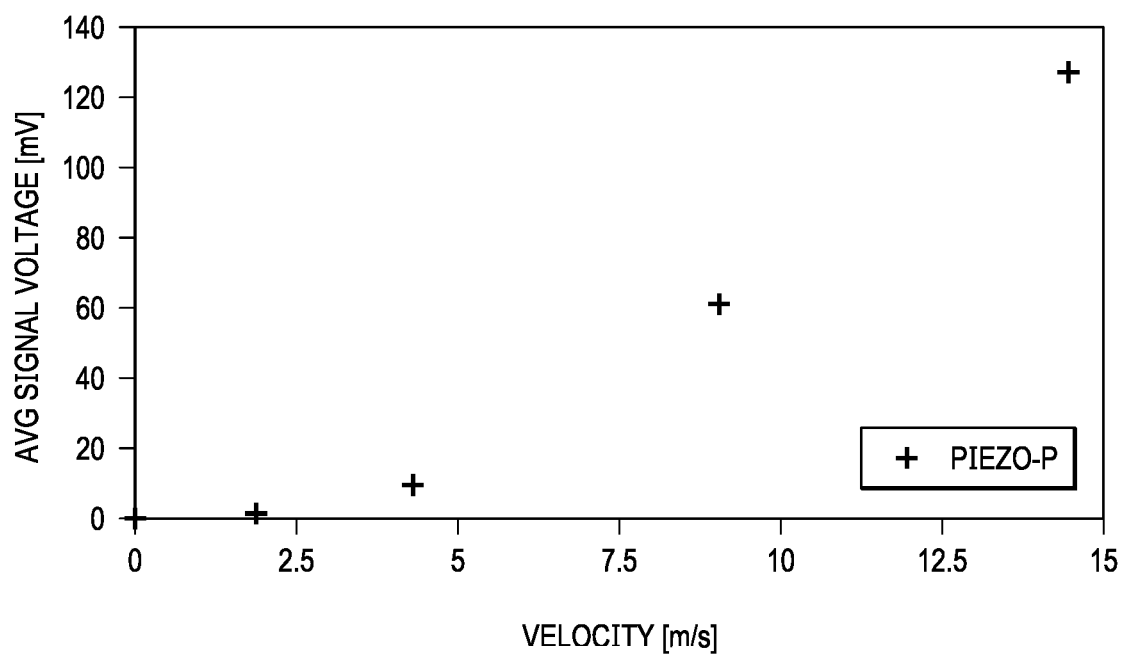
FIG. 11 depicts a graph illustrating the resulting signal generated by Piezo-P in the circular test section setup in accordance with an illustrative embodiment.

FIG. 11 depicts a graph illustrating the resulting signal generated by Piezo-P in the circular test section setup in accordance with an illustrative embodiment. Each point represents the average RMS value.

In this example, State 0 is measured when the fan is off and there is no air flowing. The trend of the data shows that as the flow rate increases, the signal output voltage from the piezoelectric increases. The trend of the increase in voltage is non-linear and reaches the highest voltage at the corresponding highest velocity. The highest voltage measured for Piezo-P is 126.7 mV.

Figure 12:
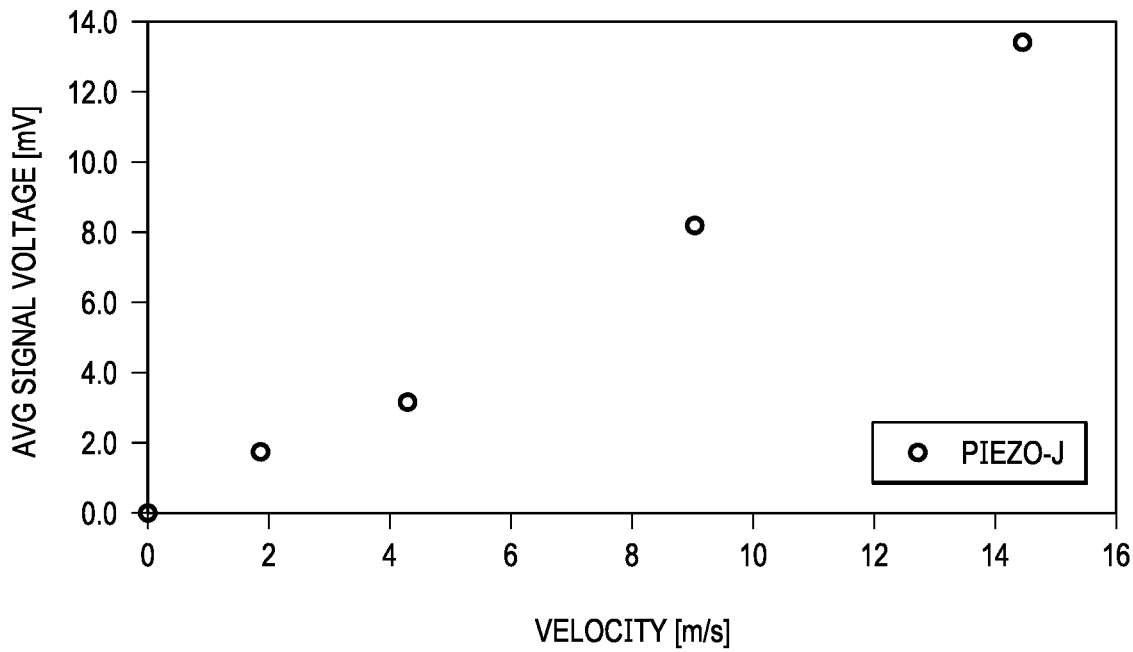
FIG. 12 depicts a graph illustrating the resulting signal generated by Piezo-J in the circular test section setup in accordance with an illustrative embodiment.

FIG. 12 depicts a graph illustrating the resulting signal generated by Piezo-J in the circular test section setup in accordance with an illustrative embodiment. Similar to Piezo-P, the trend of the data shows that output signal is increasing with the increasing air flow. For Piezo-J, a significant decrease in the magnitude of voltage produced is seen at the highest velocity tested. Maximum voltage of 13.2 mV is observed at the test velocity of 13.8 m/s. It is also observed that at the zero velocity there is a voltage signal measured, corresponding to a bias error in the measurements. This effect is also observed for measurements with Piezo-P but is more evident for Piezo-J.

In the present examples, the differences in the output of the Piezo-J and Piezo-P can be attributable to several factors including the contact area, thickness, and drag force acting on the piezoelectric. Contact area for Piezo-P (11.6 cm$^2$), is significantly higher than the contact area for Piezo-J (3 cm$^2$). In addition, Piezo-P is thinner (0.06 cm) compared to Piezo-J (0.1 cm). The thinner piezoelectric is more flexible. The effect of drag is also related to the geometry and average velocity profile seen by the piezoelectric. The drag can be calculated for each piezoelectric to quantify the drag acting on the sensor.

Figure 13:
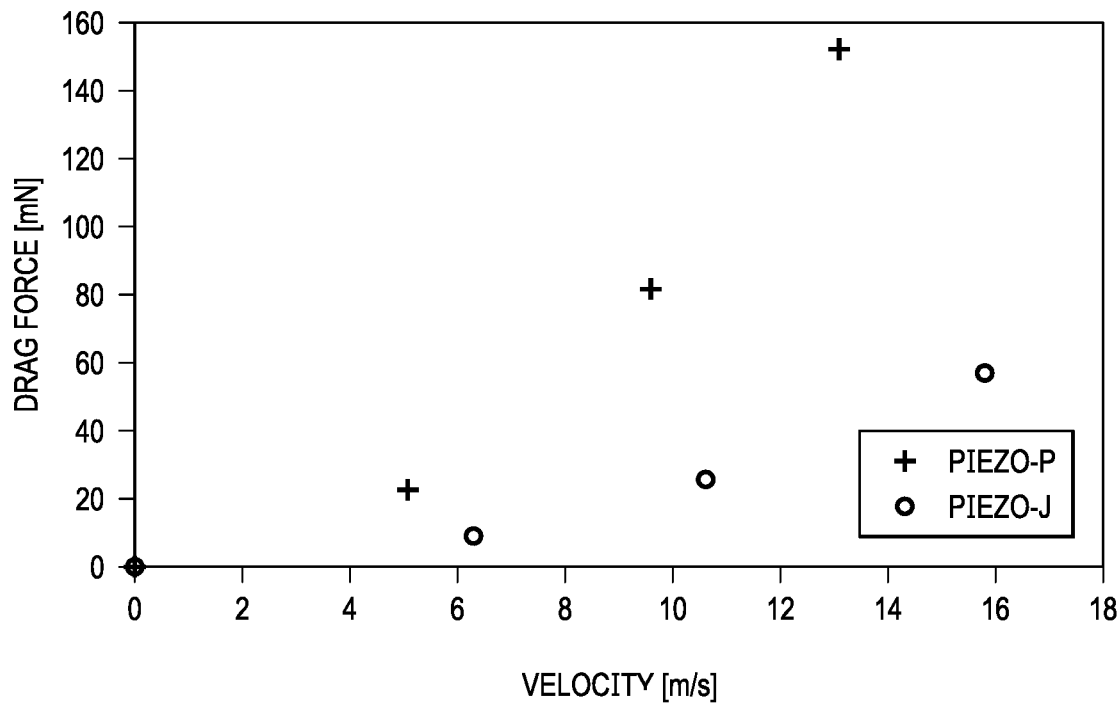
FIG. 13 depicts a graph illustrating the estimated drag force based on the averaged velocities and area of the piezoelectric sensor in accordance with illustrative embodiments.

FIG. 13 depicts a graph illustrating the estimated drag force based on the averaged velocities and area of the piezoelectric sensor in accordance with illustrative embodiments. In this example, the parameters in Eq. (6) remain nearly constant, with velocity varying in a parabolic fashion. Piezo-P reaches a maximum drag force at the highest velocity, which is also observed for Piezo-J. The magnitude of the drag acting on Piezo-P is 4.5 times greater than the drag on Piezo-J and has a very similar trend than what is observed for the measured velocity and voltage output values. This difference is due to the nearly four times larger area of Piezo-P compared to Piezo-J. Voltage output measured from the piezoelectric sensors at the highest velocity is 4.8 times greater for Piezo-P compared to Piezo-J, which falls within experimental uncertainty of the two measurements. Therefore, the drag force accounts for most of the motion and produced voltage from the sensor.

Based on these results, it is possible to estimate the flow velocity within a circular cross-sectional test area. The drag acting on the sensor creates a force that results in higher voltage output and accounts for the increase in output. Future experiments may demonstrate that the sensor can also be modified to measure mass flow rate and rapid velocity fluctuations that may occur in the test section.

Figure 14:
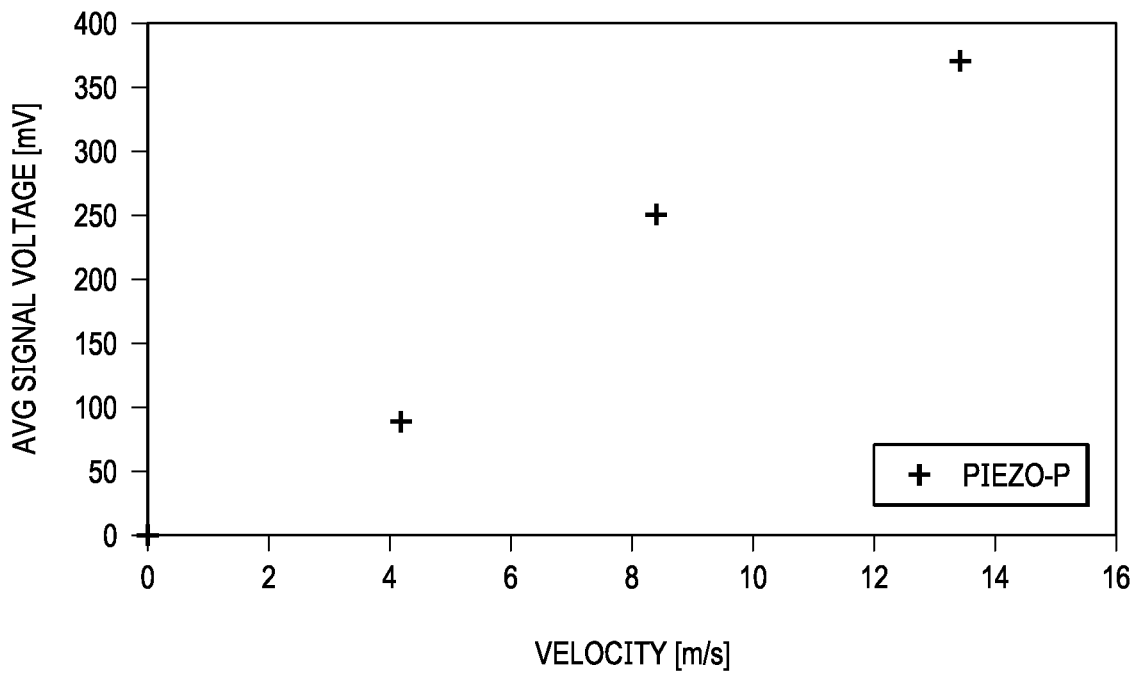
FIG. 14 depicts a graph illustrating the resulting signal generated by Piezo-P at different tested velocity in the rectangular test section setup in accordance with an illustrative embodiment.
Figure 15:
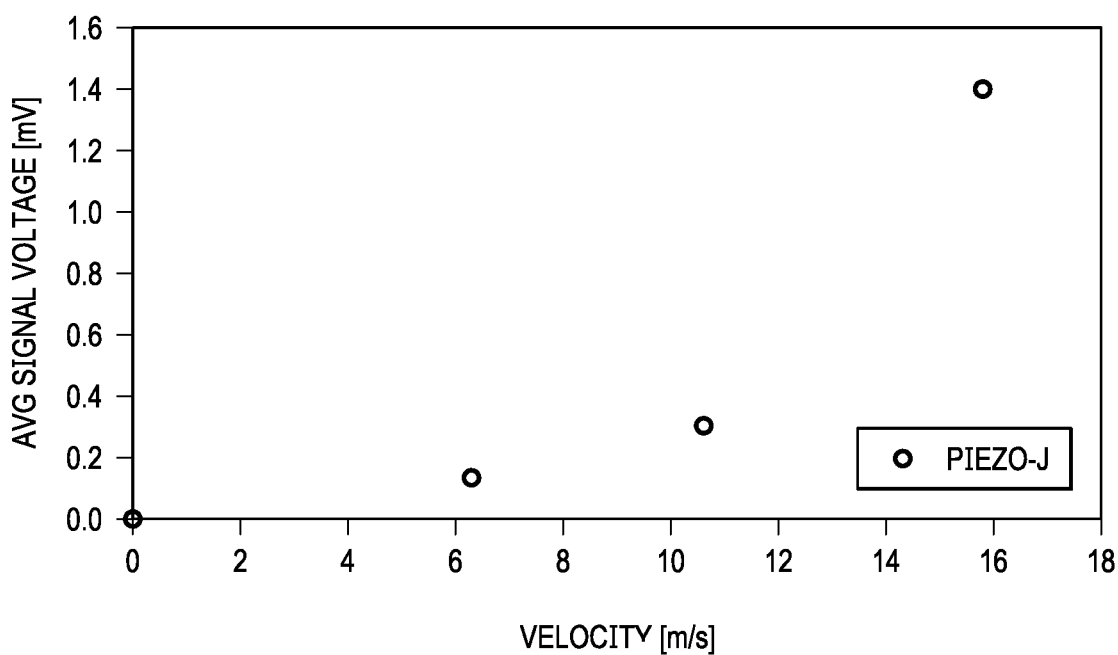
FIG. 15 depicts a graph illustrating Piezo-J output voltage at the different tested velocities in the rectangular test section setup in accordance with an illustrative embodiment.

FIGS. 14 and 15 illustrate the impact of the velocity profile on the voltage output of the sensor. In the previous section, a circular cross section with a nearly uniform velocity profile produced a significant increase in voltage for higher tested velocities. In order to test the response of the sensor for a different, less uniform profile, the rectangular cross section testing unit is used. The two piezoelectric sensors produced different output voltages.

FIG. 14 depicts a graph illustrating the resulting signal generated by Piezo-P at different tested velocities in the rectangular test section setup in accordance with an illustrative embodiment. Each point is the RMS value. The trend of the data shows that the output signal is increasing when the air flow velocity is increased and reaches the highest voltage at the corresponding highest velocity. The highest voltage is measured for Piezo-P at 370 mV, which is the highest voltage measured for any of the test conditions.

FIG. 15 depicts a graph illustrating Piezo-J output voltage at the different tested velocities in the rectangular test section setup in accordance with an illustrative embodiment. In this example, Piezo-P produces the highest voltage in the rectangular setup when compared to the circular cross section setup or Piezo-J. The reason for this is that Piezo-P occupies much more of the rectangular test section than the circular cross section and it is more flexible. The velocity of air flow is higher at the center and near zero at the bottom. Piezo-P is exposed to the significantly higher velocities throughout the entire test section. Since the sensor experiences a higher average velocity, it produces significantly higher voltage output. Since Piezo-J is shorter and located closer to the wall and has a larger overall percentage of its area inside of the boundary layer, the voltage output is significantly less than Piezo-P.

In order to estimate the drag acting on the sensor for the different velocity profiles from rectangular test section, drag is calculated for each piezoelectric.

Figure 16:
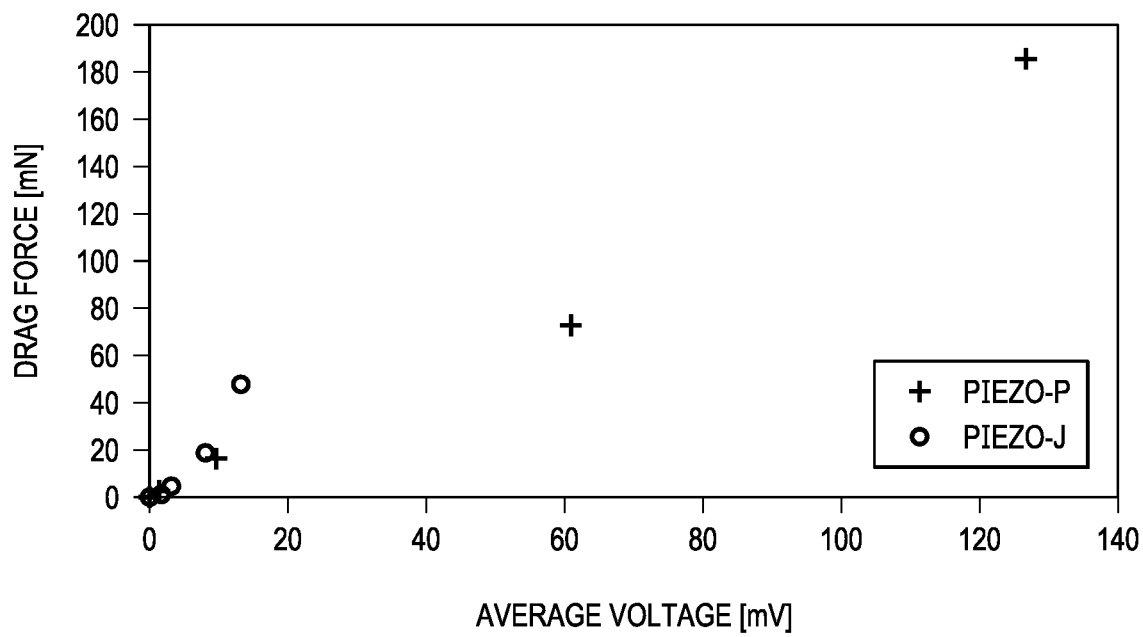
FIG. 16 depicts a graph illustrating a comparison of drag force and average voltage generated by Piezo-J and Piezo-P for different test states in accordance with illustrative embodiments.

FIG. 16 depicts a graph illustrating a comparison of drag force and average voltage generated by Piezo-J and Piezo-P for different test states in accordance with illustrative embodiments. In this example, Piezo-J produces up to 142.5 times less voltage than Piezo-P at the same conditions. As mentioned above, this difference indicates that the velocity profile exposed to the piezoelectric significantly impacts the voltage output from the sensor. To further illustrate this point, Piezo-J produces 11 times less voltage when placed in the rectangular test section setup compared to the circular cross-sectional setup. The same trends for voltage and velocity are observed for both piezoelectric configurations, demonstrating the influence of drag force on the sensor.

The influence of drag is apparent for the RTS but does not account for the much higher voltage output. In the RTS, the average velocity profiles are presented. However, due to the sudden expansion from the circular inlet port to the rectangular test section there may be areas of recirculation or flow irregularities not captured by measurement of average velocity. Other potential factors that may contribute to the much higher voltage output of the sensor include material thickness, flexibility, and turbulence levels in the system.

This influence shows the relationship between the calculated drag force acting on Piezo-P and Piezo-J and the voltage generated in the CTS. Both sensors have second order polynomial which fit the prediction from eq (6). Also, Piezo-P has higher drag force due to the higher area and reach 185 mV to respond 126 mN.

Figure 17:
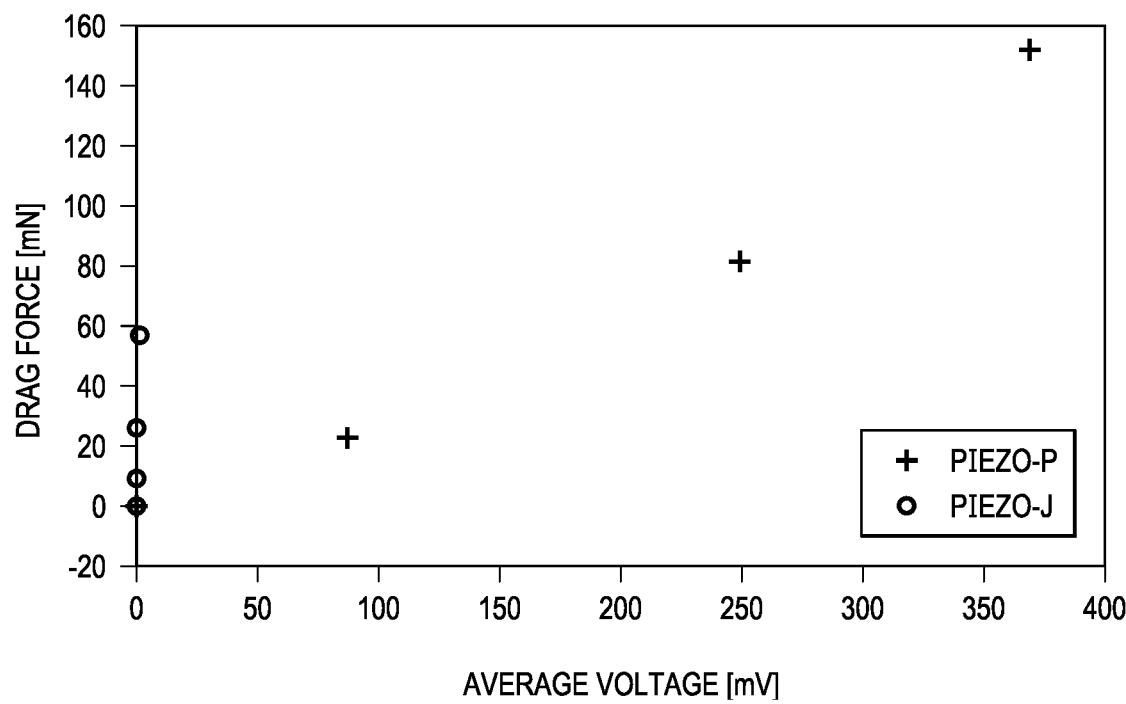
FIG. 17 depicts a graph illustrating the relationship between the calculated drag force acting on the Piezo-P and Piezo-J and the voltage generated in the RTS in accordance with illustrative embodiments.

FIG. 17 depicts a graph illustrating the relationship between the calculated drag force acting on the Piezo-P and Piezo-J and the voltage generated in the RTS in accordance with illustrative embodiments. Both sensors have second order polynomial which fit the prediction from eq (6). Similar to CTS, Piezo-P has higher drag force due to the higher area. The voltage generated from Piezo-J is very small.

As used herein, the phrase "a number" means one or more. The phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item C. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

The illustrative embodiments provide method for predicting changes in customer demand. The method comprises collecting subscription data for a number of customers at specified time intervals, wherein each customer is subscribed to one of a number of defined bundles of services. The method further comprises determining any changes in customer bundle subscriptions during a given time interval, and determining metrics for defined customer tasks for subscribed services during the given time interval. From this data, the method simultaneously models, via multimodal multi-task learning, bundle subscription change events and time-to-event for each bundle subscription change. The method then predicts, according the modeling, types and timing of changes in customer bundle subscriptions based on customer service activities. By predicting both the types of changes in bundles subscriptions and the timing of those changes, the illustrative embodiments allow proactive steps to be taken to assist customers in making changes or to mitigate negative changes. Such proactive steps might comprise targeted marketing or incentive to customers or speeding up changes to bundle subscriptions. The anticipatory, proactive steps can provide cost and time savings for both customers and service providers.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method of measuring fluid flow rate, the method comprising:
    positioning a piezoelectric sensor in a fluid flow stream, wherein the piezoelectric sensor comprises a piezoelectric test article positioned in the fluid flow stream and wherein a rectangular shaped contact area of the piezoelectric test article comprising two contiguous rectangular shaped sections having different thicknesses is maintained perpendicular to the fluid flow stream;
    measuring a voltage output from vibration of the piezoelectric sensor caused by mechanical stress from the fluid flow stream; and
    calculating a fluid flow rate based on the measured voltage output according to predefined relationships between the voltage output and a number of physical parameters.

2. The method of claim 1, wherein the piezoelectric sensor comprises a piezoelectric cantilever beam.

3. The method of claim 1, wherein the piezoelectric sensor comprises lead zirconate titanite.

4. The method of claim 1, wherein voltage output is positively correlated with fluid flow rate.

5. The method of claim 1, wherein voltage output is non-linearly correlated with fluid flow rate.

6. The method of claim 1, wherein the physical parameters comprise:
    piezoelectric sensor contact area;
    piezoelectric sensor thickness;
    drag force; and
    fluid pressure.

7. The method of claim 1, wherein the fluid flow stream passes through a rectangular test section, and wherein the piezoelectric sensor is positioned in a rectangular test section.

8. The method of claim 1, wherein the fluid flow stream passes through a circular test section, and wherein the piezoelectric sensor is positioned in a rectangular test section.

9. The method of claim 1, further comprising positioning a flow straightener upstream of the piezoelectric sensor in the fluid flow stream.

10. The method of claim 1, wherein the two contiguous rectangular shaped sections comprise a piezoelectric ceramic section and a flapper section and wherein a thickness of the flapper section is less than a thickness of the piezoelectric ceramic section.

11. An apparatus for measuring fluid flow rate, the apparatus comprising:
    a fan operable to generate a fluid flow stream;
    a piezoelectric sensor positioned in the fluid flow stream, wherein the piezoelectric sensor comprises a piezoelectric test article positioned in the fluid flow stream and wherein a rectangular shaped contact area of the piezoelectric test article comprising two contiguous rectangular shaped sections having different thicknesses is maintained perpendicular to the fluid flow stream;
    a test section in fluid communication with the fan, wherein the piezoelectric sensor is positioned in the test section; and
    an oscilloscope connected to the piezoelectric sensor measures a voltage output from vibration of the piezoelectric sensor caused by mechanical stress from the fluid flow stream, wherein the measured voltage output is correlated to fluid flow rate according to predefined relationships between the voltage output and a number of physical parameters.

12. The apparatus of claim 11, wherein the piezoelectric sensor comprises a piezoelectric cantilever beam.

13. The apparatus of claim 11, wherein the piezoelectric sensor comprises lead zirconate titanite.

14. The apparatus of claim 11, wherein voltage output is positively correlated with fluid flow rate.

15. The apparatus of claim 11, wherein voltage output is non-linearly correlated with fluid flow rate.

16. The apparatus of claim 11, wherein the test section is a rectangular test section.

17. The apparatus of claim 11, wherein the test section is a circular test section.

18. The apparatus of claim 11, wherein the physical parameters comprise:
    piezoelectric sensor contact area;
    piezoelectric sensor thickness;
    drag force; and
    fluid pressure.

19. The apparatus of claim 11, further comprising a flow straightener upstream of the piezoelectric sensor in the fluid flow stream.

20. The apparatus of claim 11, wherein the two contiguous rectangular shaped sections comprise a piezoelectric ceramic section and a flapper section and wherein a thickness of the flapper section is less than a thickness of the piezoelectric ceramic section.

* * * * *